United States Patent
Sim et al.

(10) Patent No.: US 9,077,196 B2
(45) Date of Patent: Jul. 7, 2015

(54) BATTERY PACK AND POWER GENERATION CIRCUIT IN BATTERY PACK

(75) Inventors: Se-Sub Sim, Yongin-si (KR); Susumu Segawa, Yongin-si (KR); Masami Omagari, Yongin-si (KR); Jin-Wan Kim, Yongin-si (KR); Young-Shin Cho, Yongin-si (KR)

(73) Assignee: Samsung SDI Co., Ltd (KR)

( * ) Notice: Subject to any disclaimer, the term of this patent is extended or adjusted under 35 U.S.C. 154(b) by 339 days.

(21) Appl. No.: 13/585,088

(22) Filed: Aug. 14, 2012

(65) Prior Publication Data

US 2013/0221924 A1 Aug. 29, 2013

(30) Foreign Application Priority Data

Feb. 28, 2012 (KR) .................. 10-2012-0020396

(51) Int. Cl.
*H02J 7/00* (2006.01)
*G01R 31/36* (2006.01)

(52) U.S. Cl.
CPC ............. *H02J 7/0063* (2013.01); *H02J 7/0065* (2013.01); *H02J 2007/0098* (2013.01); *G01R 31/3658* (2013.01)

(58) Field of Classification Search
CPC ........... H02J 3/32; H02J 7/0065; H02J 7/007; B06L 11/1861; B06L 11/1611; Y02T 90/127
USPC ................. 329/116–118, 121, 127, 134–136; 320/112, 116–119, 121, 124–127, 320/134–136
See application file for complete search history.

(56) References Cited

U.S. PATENT DOCUMENTS

| 2009/0051323 A1* | 2/2009 | Sato et al. ..................... 320/134 |
| 2009/0208821 A1* | 8/2009 | Kosugi et al. ................... 429/61 |
| 2010/0141219 A1* | 6/2010 | Li .................................. 320/162 |
| 2010/0219792 A1 | 9/2010 | Tsumura |
| 2011/0163701 A1 | 7/2011 | Carrier et al. |
| 2011/0163723 A1 | 7/2011 | Tan et al. |

FOREIGN PATENT DOCUMENTS

KR 1020100092887 8/2010

* cited by examiner

*Primary Examiner* — Paul Dinh
(74) *Attorney, Agent, or Firm* — Knobbe Martens Olson & Bear LLP

(57) ABSTRACT

A battery pack and a power generation circuit in the battery pack are disclosed. The battery pack includes a battery cell unit including battery cells connected in series, a charge/discharge switch connected between the battery cell unit and charge/discharge terminals, a charge/discharge controller controlling the charge/discharge switch to charge or discharge the battery cell unit, and a voltage converter electrically connected in parallel to the charge/discharge switch and dropping a voltage of the battery cell unit, and outputting the dropped voltage as power of the charge/discharge controller.

10 Claims, 3 Drawing Sheets

US 9,077,196 B2

BATTERY PACK AND POWER GENERATION CIRCUIT IN BATTERY PACK

CROSS-REFERENCE TO RELATED APPLICATIONS

This application claims the benefit of Korean Patent Application No. 10-2012-0020396, filed on Feb. 28, 2012, in the Korean Intellectual Property Office, the disclosure of which is incorporated herein in its entirety by reference.

BACKGROUND

1. Field

One or more embodiments of the present invention relate to a battery pack, and a power generation circuit in the battery pack.

2. Description of the Related Technology

As portable devices such as mobile phones, portable audio devices, digital cameras, or laptop computers have recently been widely spread, there is a growing demand for battery packs. Battery packs have high stability, small sizes, and a small thickness, and thus, they are suitable to be carried.

In general, it is difficult for one battery cell to generate a sufficient amount of electricity for a laptop computer or some other computing devices. Accordingly, a battery pack in which a plurality of battery cells are connected in series or in parallel is used as a power source for such computers and computing devices.

SUMMARY OF CERTAIN INVENTIVE ASPECTS

One or more embodiments of the present invention include a battery pack for generating power of a battery management system (BMS) at low cost, when a voltage of a battery cell is a high voltage, by using the voltage of the battery cell, and a power generation circuit in the battery pack.

Additional aspects will be set forth in part in the description which follows and, in part, will be apparent from the description, or may be learned by practice of the presented embodiments.

According to one or more embodiments, a battery pack includes: a battery cell unit including a plurality of battery cells connected in series, a charge/discharge switch connected between the battery cell unit and charge/discharge terminals, a charge/discharge controller configured to control the charge/discharge switch to charge or discharge the battery cell unit, and a voltage converter electrically connected in parallel to the charge/discharge switch, configured to drop a voltage of the battery cell unit and to output the dropped voltage as power of the charge/discharge controller.

The voltage converter may include: a voltage detector configured to output a voltage of the battery cell unit a first voltage converter configured to drop the voltage of the battery cell unit and to output the dropped voltage as a first converted voltage and a second voltage converter configured to drop the first converted voltage to a second converted voltage and to output the second converted voltage as power of the charge/discharge controller.

The voltage detector may include: a first diode connected between the battery cell unit and the charge/discharge switch and outputting a voltage of the battery cell unit to a first node, and a second diode connected between the charge/discharge switch and the charge/discharge terminals and outputting the voltage of the battery cell unit to the first node.

The first voltage converter may include a first Zener diode configured to drop a voltage of the battery cell unit to the first converted voltage.

The first voltage converter may also include: a first field effect transistor connected in parallel to the first Zener diode and configured to output the first converted voltage, and a third Zener diode connected in parallel to the first field effect transistor and configured to protect the first field effect transistor.

The first field effect transistor may include a gate connected to an end of the first Zener diode and a drain connected to a first node that is configured to output a voltage of the battery cell unit, wherein the third Zener diode is connected in parallel to the gate and a source of the first field effect transistor.

The second voltage converter may include a second Zener diode that is configured to drop the first converted voltage to the second converted voltage.

The second voltage converter may include: a second field effect transistor connected in parallel to the second Zener diode and configured to output the second converted voltage, and a fourth Zener diode connected in parallel to the second field effect transistor and configured to protect the second field effect transistor.

The second field effect transistor may include a gate connected to an end of the second Zener diode and a drain connected to a third node that is configured to output the first converted voltage, where the fourth Zener diode is connected in parallel to the gate and a source of the second field effect transistor.

The second voltage converter may include a regulator that drops the first converted voltage to the second converted voltage.

According to another aspect, a power generation circuit for supplying power to a controller that is configured to control a battery cell unit of a battery pack where a plurality of battery cells are connected in series to be charged or discharged includes: a voltage detector configured to output a voltage of the battery cell unit, a first voltage converter configured to drop the voltage of the battery cell unit and to output the dropped voltage as a first converted voltage, and a second voltage converter configured to drop the first converted voltage to a second converted voltage and to output the second converted voltage as power of the controller.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Figure 1:
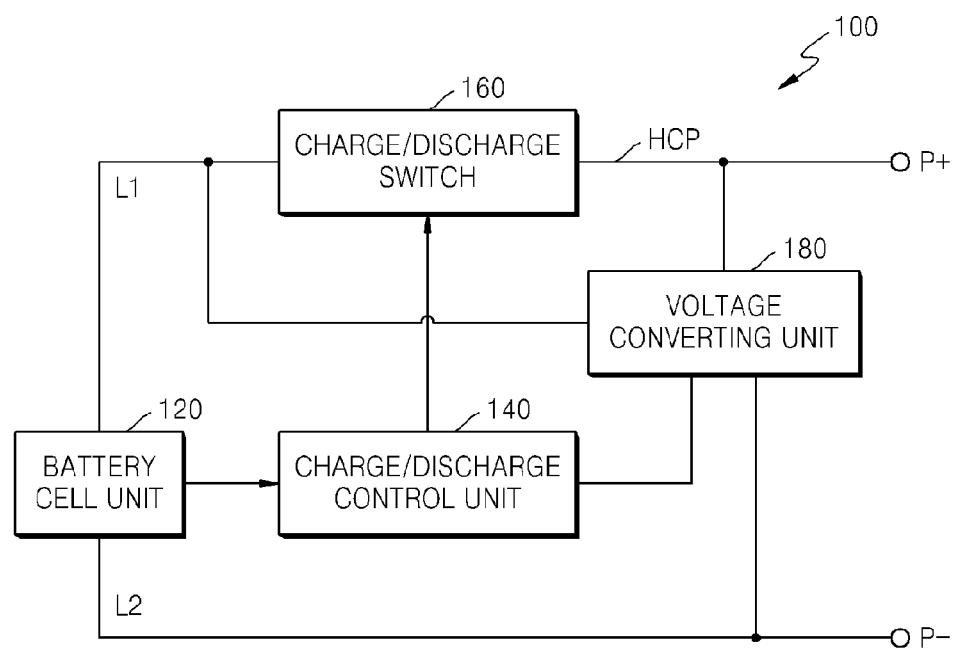
FIG. 1 is a block diagram illustrating an embodiment of a protection circuit of a battery pack.

As the invention allows for various changes and numerous embodiments, particular embodiments will be illustrated in the drawings and described in detail in the written description. In the drawings, like reference numerals generally denote like elements throughout. In the description of the present inventive concepts, when publicly known techniques or structures related to the present inventive concepts may unnecessarily make the present disclosure unclear, the detailed description of such known techniques or structures will be omitted.

FIG. 1 is a block diagram illustrating an embodiment of protection circuit of a battery pack 100.

Referring to FIG. 1, the battery pack 100 includes a battery cell unit 120 that is rechargeable, and the protection circuit. The battery pack 100 is mounted on an external system such as, for example, a portable laptop computer which may be a personal computer (PC), and performs charging and discharging of the battery cell unit 120.

The battery pack 100 includes the battery cell unit 120, and the protection circuit that includes outer terminals P+ and P− connected in parallel to the battery cell unit 120, a charge/discharge switch 160 connected in series to a high current path (hereinafter, referred to as an 'HCP') between the battery cell unit 120 and the outer terminals P+ and P−, a charge/discharge control unit 140 connected in parallel to the battery cell unit 120 and the charge/discharge switch 160, and a voltage converting unit 180 for supplying power of the charge/discharge control unit 140.

Although not shown in FIG. 1, the protection circuit of the battery pack 100 may further include a current sensing unit connected in series with the HCP between the battery cell unit 120 and the outer terminals P+ and P− and also connected to the charge/discharge control unit 140. The protection circuit may also include a self-protection control device that melts a fuse located in the HCP under the control of the charge/discharge control unit 140 or the external system. If it is determined that the battery cell unit 120 is over-charged or over-discharged, the charge/discharge control unit 140 suppresses over-charge or over-discharge of the battery cell unit 120 by turning off the charge/discharge switch 160 or melting the fuse (not shown). In such situations, the charge/discharge control unit 140 outputs a corresponding control signal and melts the fuse by using the self-protection control device of the fuse.

The battery pack 100 constructed as described above is connected to an external system via the outer terminals P+ and P−, and is charged or discharged. The HCP between the outer terminals P+ and P− and the battery cell unit 120 is used as a charge/discharge path via which high current flows. The battery pack 100 may further include a system management bus (SMBUS) (not shown) disposed between the outer terminals P+ and P− and the charge/discharge control unit 140 of the protection circuit in order to communicate with the external system.

Although the battery cell unit 120 may be a rechargeable lithium ion battery, a rechargeable lithium polymer battery, or an equivalent thereof, a type of the battery cell unit 120 is not limited thereto. An anode charge/discharge path L1 is formed at an anode of the battery cell unit 120, and a cathode charge/discharge path L2 is formed at a cathode of the battery cell unit 120. The terminal P+ that is a positive charge/discharge terminal is disposed at an end of the anode charge/discharge path L1, and the terminal P− that is a negative charge/discharge terminal, is disposed at an end of the cathode charge/discharge path L2. The outer terminals P+ and P− are connected to a load (not shown) to transmit electricity stored in the battery cell unit 120 to the load, or are connected to a charger (not shown) to supply electricity to the battery cell unit 120 from the charger.

The battery cell unit 120 may include a plurality of battery cells that are connected in series. The number of battery cells may vary according to a capacity of the battery pack 100 or a capacity of the battery cell unit 120.

The charge/discharge control unit 140 is a battery management system (BMS) that is connected in parallel to the battery cell unit 120 which senses a voltage and current of the battery cell unit 120, and outputs a control signal for controlling charging/discharging of the battery pack 100 according to the voltage and the current sensed. In order to control charging/discharging, the charge/discharge control unit 140 may measure a voltage level of each of the plurality of battery cells of the battery cell unit 120. Since the charge/discharge control unit 140 has a predetermined withstand voltage, the charge/discharge control unit 140 needs to be designed in accordance with the predetermined withstand voltage.

The charge/discharge switch 160 connects or disconnects the anode and cathode charge/discharge paths L1 and L2 under the control of the charge/discharge control unit 140.

The voltage converting unit 180 is a power generation circuit that supplies power in a range of the predetermined withstand voltage of the charge/discharge control unit 140. The voltage converting unit 180 is connected in parallel to the charge/discharge switch 160. The voltage converting unit 180 drops a voltage of the battery cell unit 120, and outputs the dropped voltage as power of the charge/discharge control unit 140.

In a conventional battery pack in which a plurality of battery cells are connected in series, in order to supply power of a charge/discharge control unit, a voltage of a specific battery cell is used, a regulator is used, or separate external power is supplied. If one of these options is used to supply power, a voltage (or potential) of the specific battery cell may be reduced, the regulator may be an expensive regulator having a high voltage, and leakage current may not be limited even at a low voltage of a battery cell. Limiting the leakage current may include ensuring that power is not supplied to the charge/discharge control unit when a voltage of the battery cell is a low voltage. If power is supplied to the regulator even when the charge/discharge control unit does not operate, the regulator continuously converts a voltage and outputs a resultant voltage, thereby causing current to flow. Accordingly, leakage current may not be limited by using the regulator.

According to embodiments disclosed herein, when a voltage of the battery cell unit 120 in which the battery cells are connected in series is a high voltage, the voltage converting unit 180, which includes a diode and a transistor, gradually drops the voltage of the battery cell unit 120 and supplies the dropped voltage as power in a range of the predetermined withstand voltage of the charge/discharge control unit 140. When a voltage of the battery cell unit 120 in which the battery cells are connected in series is a low voltage, the voltage converting unit 180 limits leakage current by turning off the transistor of the voltage converting unit 180.

Figure 2:
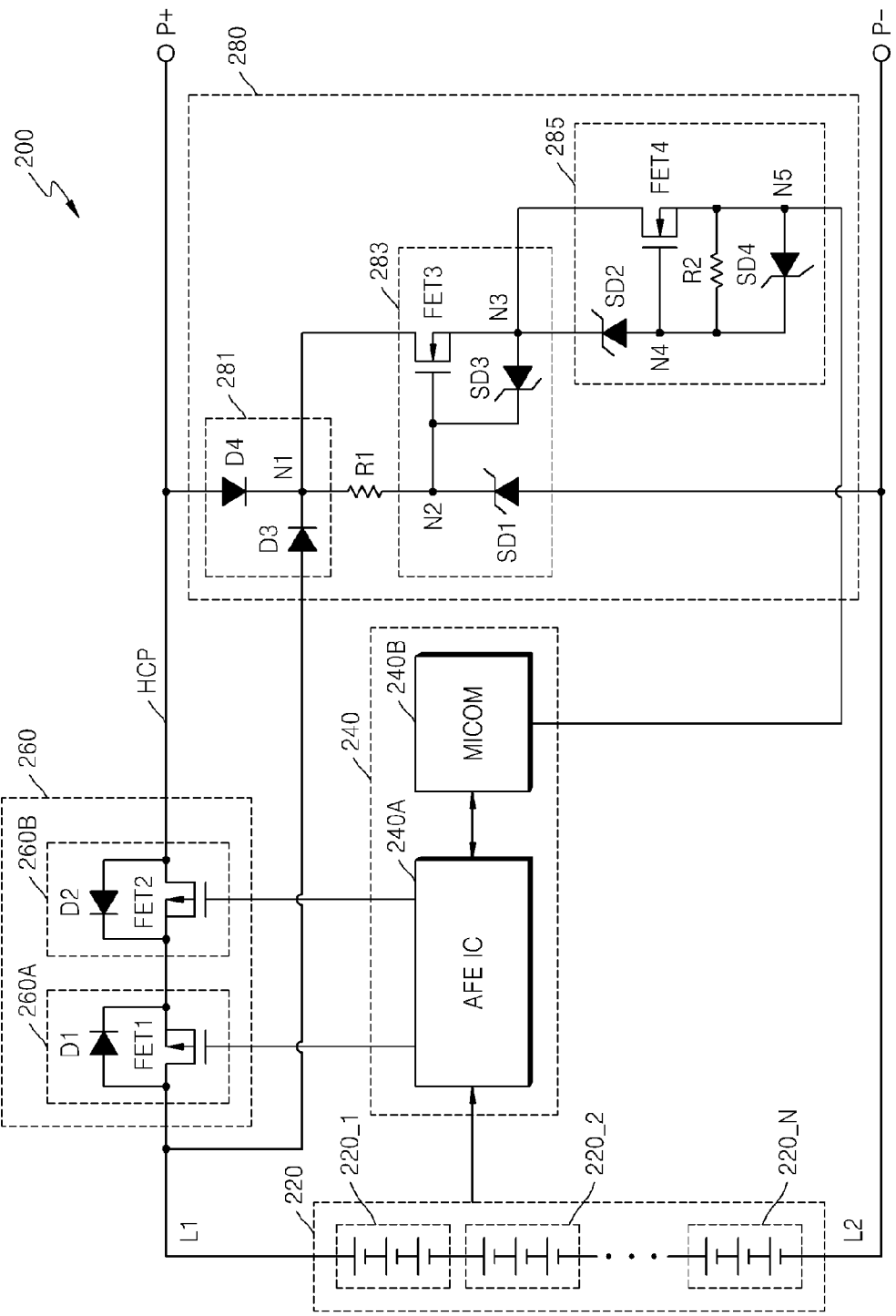
FIG. 2 is a circuit diagram illustrating an embodiment of a protection circuit of a battery pack.

FIG. 2 is a circuit diagram illustrating an embodiment of a protection circuit of a battery pack 200.

Referring to FIG. 2, the battery pack 200 includes a battery cell unit 220, and the protection circuit that includes outer terminals P+ and P− connected in parallel to the battery cell unit 220, a charge/discharge switch 260, which includes a charge element 260A and a discharge element 260B, connected in series to an HCP between the battery cell unit 220 and the outer terminals P+ and P−, a charge/discharge control unit 240 connected in parallel to the battery cell unit 220 and the charge/discharge switch 260, and a voltage converting unit 280 for supplying power of the charge/discharge control unit 240.

Although not shown in FIG. 2, the protection circuit of the battery pack 200 may further include other elements such as, for example, a current sensing unit, a fuse, and the like.

The battery pack 200 constructed as described above is connected to an external system (for example, a load or a charger) via the outer terminals P+ and P−, and is charged or discharged.

The battery cell unit 220 may be a rechargeable lithium ion battery, a rechargeable lithium polymer battery, or an equivalent thereof, but a type of the battery cell unit 220 is not limited thereto. An anode charge/discharge path L1 is formed at an anode of the battery cell unit 220 and a cathode charge/discharge path L2 is formed at a cathode of the battery cell unit 220. The outer terminal P+ that is a positive charge/discharge is disposed at an end of the anode charge/discharge path L1 and the outer terminal P− that is a negative charge/discharge terminal is disposed at an end of the cathode charge/discharge path L2. The outer terminals P+ and P− are connected to a load (not shown) to transmit electricity stored in the battery cell unit 220 to the load, or are connected to a charger (not shown) to supply electricity to the battery cell unit 220 from the charger.

The battery cell unit 220 may include a plurality of battery cells 220_1, 220_2, . . . 220_N (here, N is natural number) that are connected in series. The number of battery cells 220_1, 220_2, . . . , 220_N may vary according to a capacity of the battery pack 200 or a capacity of the battery cell unit 220.

A charge/discharge switch 260 cuts off or connects the anode and cathode charge/discharge paths L1 and L2 under the control of the charge/discharge control unit 240. The charge element 260A and the discharge element 260B are connected in series between the outer terminal P+ that is a positive charge/discharge terminal (or the outer terminal P− that is a negative charge/discharge terminal) and the anode charge/discharge path L1 (or the cathode charge/discharge path L2) of the battery cell unit 220, and allow the battery pack 200 to perform charging or discharging. The charge element 260A includes a first field effect transistor FET1 and a first parasitic diode D1 and the discharge element 260B includes a second field effect transistor FET2 and a second parasitic diode D2.

A current flow direction between a source and a drain of the first field effect transistor FET1 of the charge element 260A is set to be opposite to that between a source and a drain of the second field effect transistor FET2 of the discharge element 260B. In this configuration, the first field effect transistor FET1 of the charge element 260A is connected to limit the flow of current to the battery cell unit 220 from the outer terminals P+ and P−. Similarly, the second field effect transistor FET2 of the discharge element 260B is connected to limit the flow of current to the outer terminals P+ and P− from the battery cell unit 220. The first and second field effect transistors FET1 and FET2 of the charge and discharge elements 260A and 260B are shown as switching elements in FIG. 2. In other embodiments, other types of electrical elements for performing a switching function may be used.

Parasitic diodes D1 and D2 included in the charge and discharge elements 260A and 260B, respectively, are configured such that current flows in a direction opposite to a direction in which the current is limited. During discharging from the battery cell unit 220 to a load, the first field effect transistor FET1 of the charge element 260A is turned off and the second field effect transistor FET2 of the discharge element 260B is turned on, and discharge current flows through the parasitic diode D1 of the charge element 260A and the second field effect transistor FET2 of the discharge element 260.B. During charging using a charger, the first field effect transistor FET1 of the charge element 260A is turned on and the first field effect transistor FET2 of the discharge element 260B is turned off, and charge current flows through the parasitic diode D2 of the discharge element 260B and the first field effect transistor FET1 of the charge element 260A.

The charge/discharge control unit 240 is a BMS that is connected in parallel to the battery cell unit 220, senses a voltage and current of the battery cell unit 220, and outputs a control signal for controlling charging/discharging of the battery pack 200 according to the voltage and the current sensed. In order to control charging/discharging, the charge/discharge control unit 240 may measure a voltage level of each of the plurality of battery cells 220_1, 220_2, . . . , 220_N of the battery cell unit 220.

The charge/discharge control unit 240 may include an analog front-end integrated circuit (AFE IC) 240A and a microcomputer (MICOM) 240B.

The AFE IC 240A detects a voltage of the battery cell unit 220, transmits the voltage to the MICOM 240B, and controls a switching function of the charge/discharge switch 260 under the control of the MICOM 240B.

When a charger is connected via the outer terminal P+ and the outer terminal P− of the battery pack 200, the AFE IC 240A outputs a control signal to the first and second field effect transistors FET1 and FET2 such that the first field effect transistor FET1 of the charge element 260A is turned on and the second field effect transistor FET2 of the discharge element 260B is turned off, and enables the battery cell unit 220 to be charged. Similarly, when a load is connected via the outer terminal P+ and the outer terminal P− of the battery pack 200, the AFE IC 240A outputs a control signal to the first and second field effect transistors FET1 and FET2 such that the first field effect transistor FET1 of the charge element 260A is turned off and the second field effect transistor FET2 of the discharge element 260B is turned on, and enables the battery cell unit 220 to be discharged.

The MICOM 240B which is an IC connected in series between the AFE IC 240A and the external system suppresses over-charge, over-discharge, and over-current of the battery cell unit 220 by controlling the charge element 260A and the discharge element 260B by using the AFE IC 240A. The MICOM 240B suppresses over-charge, over-discharge, and over-current of the battery cell unit 220 by comparing a voltage of the battery cell unit 220 received through the AFE IC 240A from the battery cell unit 220 with a preset voltage level and outputting a control signal according to a result of the comparison to the AFE IC 240A to turn on or off the charge element 260A and the discharge element 260B. Since the MICOM 240B has a predetermined withstand voltage, the MICOM 240B needs to be designed in accordance with the predetermined withstand voltage.

The voltage converting unit 280 is a power generation circuit that supplies power in a range of the predetermined withstand voltage of the MICOM 240B. The voltage converting unit 280 is connected in parallel to the charge/discharge switch 260, drops a voltage of the battery cell unit 220, and outputs the dropped voltage as power of the MICOM 240B. The voltage converting unit 280 includes a voltage detector 281, a first voltage converter 283, and a second voltage converter 285.

The voltage detector 281 outputs a voltage of the battery cell unit 220. The voltage detector 281 includes a third diode D3 having an anode connected between the battery cell unit 220 and the charge element 260A, and a fourth diode D4 having an anode connected between the discharge element 260B and the outer terminal P+ that is a positive charge/discharge terminal. A cathode of the third diode D3 and a cathode of the fourth diode D4 are connected to a first node N1. Accordingly, a voltage of the battery cell unit 220 is output through the third diode D3 or the fourth diode D4 to the first node N1 that is an output node of the voltage detector 281. During discharging to a load, a voltage of the battery cell unit 220 is output through the third diode D3 from the first node N1. During charging using a charger, a voltage of the battery cell unit 220 is output through the fourth diode D4 from the first node N1.

The first voltage converter 283 drops a voltage of the battery cell unit 220 and outputs the dropped voltage as a first converted voltage V1. The first voltage converter 283 includes a third field effect transistor FET3 connected in parallel to a first Zener diode SD1 and a third Zener diode SD3 connected in parallel to the third field effect transistor FET3. The first Zener diode SD1 has a cathode connected to a second node N2 and an anode connected to the outer terminal P− that is a negative charge/discharge terminal. The third field effect transistor FET3 has a gate connected to the second node N2, a drain connected to the first node N1, and a source connected to a third node N3. The third Zener diode SD3 has an anode connected to the third node N3 and a cathode connected to the second node N2. The second node N2 is connected through a first resistor R1 to the first node N1.

The first Zener diode SD1 drops a voltage of the battery cell unit 220 to the first converted voltage V1, and the third field effect transistor FET3 outputs the first converted voltage V1 to the third node N3.

As the third field effect transistor FET3 connected to the first Zener diode SD1 is turned on or off, a voltage of the second node N2 is controlled such that voltages at both terminals of the first Zener diode SD1 are kept constant. The third Zener diode SD3 protects the third field effect transistor FET3 by enabling the third field effect transistor FET3 to be turned on, and keeping constant a transient over-voltage supplied to the third field effect transistor FET3. Accordingly, the first converted voltage V1 that is a voltage of the second node N2 is output to the third node N3.

The second voltage converter 285 drops the first converted voltage V1 to a second converted voltage V2 and outputs the second converted voltage V2 as power of the MICOM 240B. The second voltage converter 285 includes a second Zener diode SD2, a fourth field effect transistor FET4 connected in parallel to the second Zener diode SD2, and a second resistor R2 and a fourth Zener diode SD4 connected in parallel to the fourth field effect transistor FET4. The second Zener diode SD2 has a cathode connected to the third node N3 and an anode connected to a fourth node N4. The fourth field effect transistor FET4 has a gate connected to the fourth node N4, a drain connected to the third node N3, and a source connected to a fifth node N5. The second resistor R2 is connected between the fourth node N4 and the fifth node N5. The fourth Zener diode SD4 has a cathode connected to the fourth node N4 and an anode connected to the fifth node N5.

The second Zener diode SD2 drops the first converted voltage V1 to the second converted voltage V2, and the fourth field effect transistor FET4 outputs the second converted voltage V2 to the fifth node N5.

As the fourth field effect transistor FET4 connected to the second Zener diode SD2 is turned on or off, a voltage of the fourth node N4 is controlled such that voltages at both terminals of the second Zener diode SD2 are kept constant. The fourth Zener diode SD4 and the second resistor R2 protect the fourth field effect transistor FET4 by enabling the fourth field effect transistor FET4 to be turned on, and keeping constant a transient over-voltage supplied to the fourth field effect transistor FET4. Accordingly, the second converted voltage V2 that is a voltage of the fourth node N4 is output to the fifth node N5. The second converted voltage V2 is equal to or less than the predetermined withstand voltage of the MICOM 240B.

In FIG. 2, when a voltage of the battery cell unit 220 is a high voltage, the first voltage converter 283 drops the voltage of the battery cell unit 220 and then the second voltage converter 285 drops the dropped voltage of the battery cell unit 220 once more. Accordingly, costs may be relatively lower than a situation where, when a voltage of a battery cell unit is a high voltage, the voltage of the battery cell unit is directly dropped by using an expensive regulator.

Specifications of the first Zener diode SD1 and the second Zener diode SD2 are determined according to the number of battery cells 220_1, 220_2, ... 220_N that are connected in series. Specifications of the third Zener diode SD3 and the fourth Zener diode SD4 are determined according to specifications of the third field effect transistor FET3 and the fourth field effect transistor FET4.

When a voltage of the battery cell unit 220 is reduced to a low voltage equal to or less than a predetermined value, the charge/discharge control unit 240 may limit leakage current from the voltage converting unit 280 by turning off transistors of the voltage converting unit 280.

Figure 3:
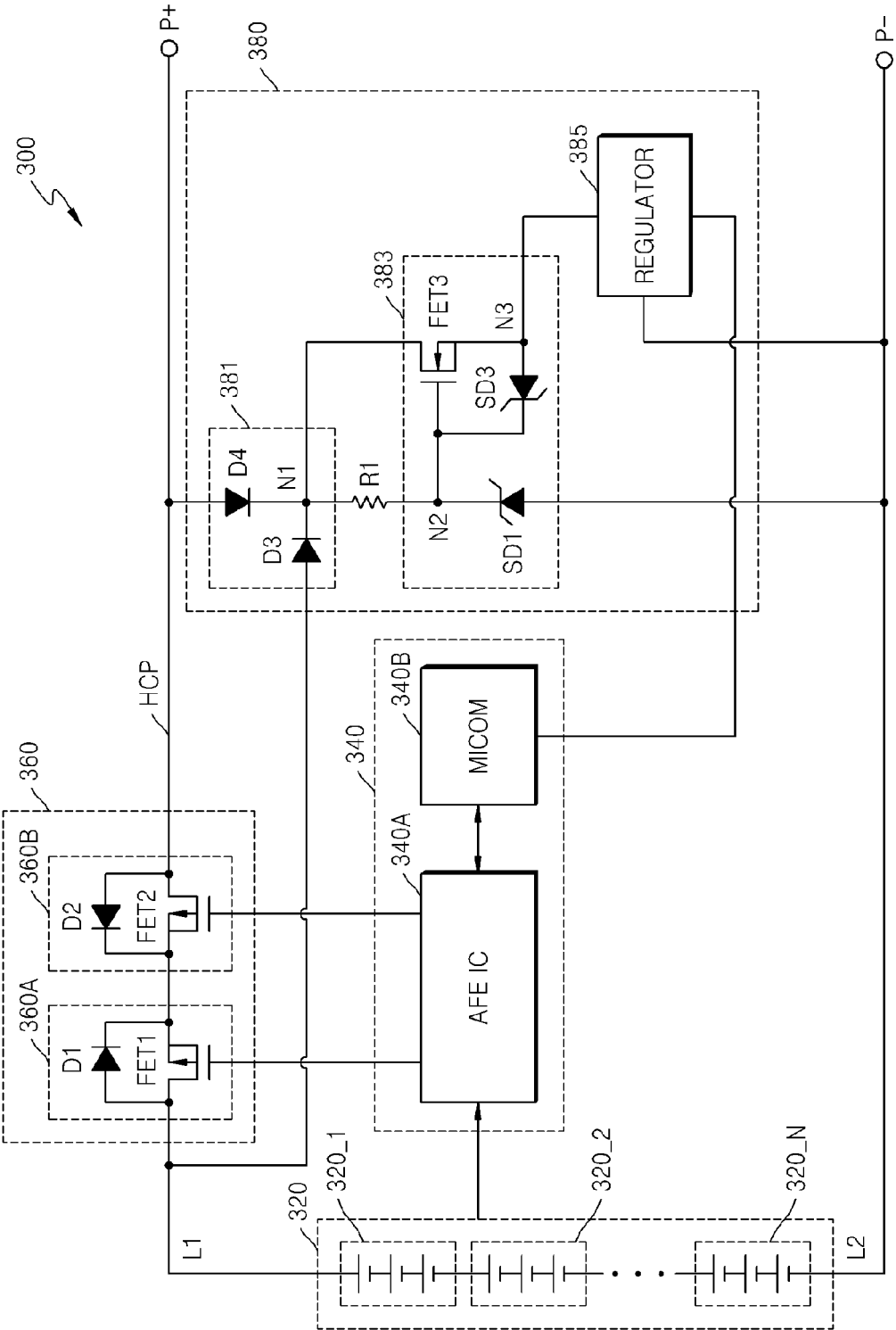
FIG. 3 is a circuit diagram illustrating another embodiment of a protection circuit of a battery pack.

FIG. 3 is a circuit diagram illustrating another embodiment of a protection circuit of a battery pack 300.

Referring to FIG. 3, the battery pack 300 includes a battery cell unit 320, and a protection circuit that includes outer terminals P+ and P− connected in parallel to the battery cell unit 320, a charge/discharge switch 360 connected in series to an HCP between the battery cell unit 320 and the outer terminals P+ and P−, a charge/discharge control unit 340 connected in parallel to the battery cell unit 320 and the charge/discharge switch 360, and a voltage converting unit 380 for supplying power of the charge/discharge control unit 340.

Although not shown in FIG. 3, the protection circuit of the battery pack 300 may further include other elements such as, for example, a current sensing unit, a fuse, and the like.

The battery pack 300 constructed as described above is connected to an external system (e.g., a load or a charger) via the outer terminals P+ and P−, and is charged or discharged.

The battery pack 300 is the same as the battery pack 200 of FIG. 2 except for the voltage converting unit 380, and thus, the following description will focus on the voltage converting unit 380.

The charge/discharge control unit 340 may include an AFE IC 340A and a MICOM 340B. Since the MICOM 340B has a predetermined withstand voltage, the MICOM 340B is designed in accordance with the predetermined withstand voltage.

The voltage converting unit 380 is a power generation circuit that supplies power in a range of the predetermined withstand voltage of the MICOM 340B. The voltage converting unit 380 is connected in parallel to the charge/discharge switch 360, drops a voltage of the battery cell unit 320, and outputs the dropped voltage as power of the MICOM 340B. The voltage converting unit 380 includes a voltage detector 381, a first voltage converter 383, and a second voltage converter 385.

The voltage detector 381 outputs a voltage of the battery cell unit 320. The voltage detector 381 includes the third diode D3 having an anode connected between the battery cell unit 320 and a charge element 360A and the fourth diode D4 having an anode connected between a discharge element 360B and the outer terminal P+ that is a positive charge/discharge terminal. A cathode of the third diode D3 and a cathode of the fourth diode D4 are connected to the first node N1. Accordingly, a voltage of the battery cell unit 320 is output through the third diode D3 or the fourth diode D4 to the first node N1 that is an output node of the voltage detector 381. During discharging to a load, a voltage of the battery cell unit 320 is output through the third diode D3 from the first node N1. During charging using a charger, a voltage of the battery cell unit 320 is output through the fourth diode D4 from the first node N1.

The first voltage converter 383 drops a voltage of the battery cell unit 320 and outputs the dropped voltage as the first converted voltage V1. The first voltage converter 383 includes the first Zener diode SD1, the third field effect transistor FET3 connected in parallel to the first Zener diode SD1, and the third Zener diode SD3 connected in parallel to the third field effect transistor FET3. The first Zener diode SD1 has a cathode connected to the second node N2 and an anode connected to the outer terminal P− that is a negative charge/discharge terminal. The third field effect transistor FET3 has a gate connected to the second node N2, a drain connected to the first node N1, and a source connected to the third node N3. The third Zener diode SD3 has an anode connected to the third node N3 and a cathode connected to the second node N2. The second node N2 is connected through the first resistor R1 to the first node N1.

The first Zener diode SD1 drops a voltage of the battery cell unit 320 to the first converted voltage V1, and the third field effect transistor FET3 outputs the first converted voltage V1 to the third node N3.

As the third field effect transistor FET3 connected to the first Zener diode SD1 is turned on or off, a voltage of the second node N2 is controlled such that voltages at both terminals of the first Zener diode SD1 are kept constant. The third Zener diode SD3 protects the third field effect transistor FET3 by enabling the third field effect transistor FET3 to be turned on, and keeping constant a transient over-voltage supplied to the third field effect transistor FET3. Accordingly, the first converted voltage V1, which is a voltage of the second node N2, is output to the third node N3.

The second voltage converter 385 is a regulator that adjusts an input voltage, such as the first converted voltage V1, and outputs a set voltage, the second converted voltage V2. A structure of the second voltage converter 385 is not limited to that shown in FIG. 3, and modifications may be made according to various designs.

When a voltage of the battery cell unit 320 is a high voltage, the first voltage converter 381 drops the voltage of the battery cell unit 320 and the second voltage converter 385 drops the dropped voltage once again. Accordingly, costs may be relatively lower than those in situations where, when a voltage of a battery cell unit is a high voltage, the voltage of the battery cell unit is directly dropped by using an expensive regulator.

Also, since a regulator is used as the second voltage converter 385, a voltage may be converted and output more accurately by using the second voltage converter 385 than by using the second Zener diode SD2 of the second voltage converter 285.

A specification of the first Zener diode SD1 is determined according to the number of plurality of battery cells 320_1, 320_2, . . . 320_N that are connected in series. A specification of the third Zener diode SD3 is determined according to a specification of the third field effect transistor FET3.

When a voltage of the battery cell unit 320 is reduced to a low voltage equal to or less than a predetermined value, the charge/discharge control unit 340 may limit leakage current from the voltage converter 380 by turning off a transistor of the voltage converting unit 380.

As described above, since a high voltage of a battery cell unit in which battery cells are connected in series is gradually dropped by using a circuit device and supplied as power of a BMS, the BMS may be designed in accordance with a predetermined withstand voltage at relatively low costs.

While the present invention has been shown and described with reference to certain embodiments thereof using specific terms, the embodiments and terms have been used to explain the present invention and should not be construed as limiting the scope of the present invention defined by the claims. The described embodiments should be considered in a descriptive sense only and not for purposes of limitation. Therefore, the scope of the invention is defined not by the detailed description but by the appended claims, and all differences within the scope should be construed as being included in the present invention.

What is claimed is:

1. A battery pack comprising:
a battery cell unit comprising a plurality of battery cells;
a charge/discharge switch connected between the battery cell unit and charge/discharge terminals;
a charge/discharge controller configured to control the charge/discharge switch to charge or discharge the battery cell unit based on a sensed voltage of the battery cell unit, wherein the charge/discharge controller is configured to operate within a predetermined voltage range; and
a voltage converter electrically connected in parallel to the charge/discharge switch, the voltage converter configured to drop the sensed voltage of the battery cell unit to within the predetermined voltage range of the charge/discharge controller, and further configured to output the dropped voltage as power to the charge/discharge controller.

2. The battery pack of claim 1, wherein the voltage converter comprises:
a voltage detector configured to sense a voltage of the battery cell unit;
a first voltage converter configured to drop the voltage of the battery cell unit and further configured to output the dropped voltage as a first converted voltage; and
a second voltage converter configured to drop the first converted voltage to a second converted voltage and further configured to output the second converted voltage to the charge/discharge controller.

3. The battery pack of claim 2, wherein the voltage detector comprises:
a first diode connected between the battery cell unit and the charge/discharge switch, the first diode configured to output a voltage of the battery cell unit to a first node; and
a second diode connected between the charge/discharge switch and the charge/discharge terminals, the second diode configured to output the voltage of the battery cell unit to the first node.

4. The battery pack of claim 2, wherein the first voltage converter comprises a first Zener diode configured to drop the sensed voltage of the battery cell unit to the first converted voltage.

5. The battery pack of claim 4, wherein the first voltage converter further comprises:
a first field effect transistor connected in parallel to the first Zener diode and configured to output the first converted voltage; and
a second Zener diode connected in parallel to the first field effect transistor and configured to protect the first field effect transistor.

6. The battery pack of claim 5, wherein the first field effect transistor comprises a gate connected to a terminal of the first Zener diode and a drain connected to a first node, the first node configured to output a voltage of the battery cell unit, wherein the second Zener diode is connected in parallel to the gate and a source of the first field effect transistor.

7. The battery pack of claim 2, wherein the second voltage converter comprises a third Zener diode configured to drop the first converted voltage to the second converted voltage.

8. The battery pack of claim 7, wherein the second voltage converter further comprises:
   a second field effect transistor connected in parallel to the third Zener diode and configured to output the second converted voltage; and
   a fourth Zener diode connected in parallel to the second field effect transistor and configured to protect the second field effect transistor.

9. The battery pack of claim 8, wherein the second field effect transistor comprises a gate connected to a terminal of the third Zener diode and a drain connected to a second node, the second node configured to output the first converted voltage, wherein the fourth Zener diode is connected in parallel to the gate and a source of the second field effect transistor.

10. The battery pack of claim 2, wherein the second voltage converter comprises a regulator configured to drop the first converted voltage to the second converted voltage.

* * * * *